United States Patent

[11] 3,576,503

[72] Inventor Delon C. Hanson
Los Altos, Calif.

[21] Appl. No. 875,999
[22] Filed Nov. 12, 1969
[45] Patented Apr. 27, 1971
[73] Assignee Hewlett-Packard Company
Palo Alto, Calif.

[54] YIG-TUNED SOLID STATE OSCILLATOR
13 Claims, 9 Drawing Figs.

[52] U.S. Cl. .......... 331/96,
331/107R, 331/107G, 331/177R, 333/82R
[51] Int. Cl. .......... H03b 7/14
[50] Field of Search .......... 331/96, 107 (R), 107 (G), 177 (R); 333/82 (R)

[56] References Cited

UNITED STATES PATENTS 3,533,016 10/1970 Grace .......... 331/107X

OTHER REFERENCES

Chang et al., " YIG-Tuned Gunn Effect Oscillator," Proceedings of the IEEE, Vol. 55, Sept. 1967. (331-107G)

James, " Wide-Range Electronic Tuning of a Gunn Diode by an Yttrium-Iron Garnet (YIG) Ferrimagnetic Resonator," Electronics Letters, Vol. 4, 18 Oct. 1968, pps. 451— 452, (331-107G)

*Primary Examiner*—Roy Lake
*Assistant Examiner*—Siegfried H. Grimm
*Attorney*—Roland I. Griffin

ABSTRACT: An output coupling loop and a tuning loop are supported about a common axis and spaced-apart in parallel planes orthogonally intersecting the common axis. These loops are magnetically coupled by a YIG sphere supported along the common axis with its center positioned between the parallel planes. The output coupling loop is electrically connected by a matched transmission line across a matched load, and the tuning loop (either alone or in combination with a series gap capacitance) is electrically connected by a pair of parallel-connected bypass capacitors across a bulk-oscillating device. One of these bypass capacitors and the bulk-oscillating device are supported on a heat sink in a plane parallel to the common axis and orthogonal to the parallel planes. Both loops, the YIG sphere, and the bulk-oscillating device are mounted in the gap between the poles of a closed loop electromagnet.

INVENTOR
DELON C. HANSON

BY Roland D. Griffin
ATTORNEY

INVENTOR
DELON C. HANSON

BY Roland I. Griffin

ATTORNEY

YIG-TUNED SOLID STATE OSCILLATOR

BACKGROUND AND SUMMARY OF THE INVENTION

This invention relates to YIG-tuned solid-state oscillators that are electrically tunable over a frequency range of an octave or more with a minimum power output in excess of +10 dbm.

In conventional YIG-tuned solid-state oscillators the output coupling and tuning loops are typically supported in orthogonal planes and about orthogonally intersecting axes with the YIG sphere positioned at the intersection of these axes. This orthogonal loop structure is supported in the gap between the poles of a closed loop electromagnet. Reducing the gap between the poles of the electromagnet reduces the power required to electrically tune the oscillator and, hence, the size and weight of the oscillator itself. One disadvantage of conventional YIG-tuned solid-state oscillators is that their orthogonal loop structure cannot readily be miniaturized, such as by using conventional thin film circuit techniques, and cannot therefore be employed in gaps as small as may be required for the minimal tuning power, size, and weight requirements of some applications.

Accordingly, the principal object of this invention is to provide an improved YIG-tuned solid-state oscillator in which the size of the loop structure and, hence, the size of the gap between the poles of the electromagnet may be significantly reduced to decrease the required electrical tuning power, size, and weight of the oscillator while maintaining a minimum power output in excess of +10 dbm.

In any YIG-tuned solid-state oscillator the self-resonant frequency, $f_{LR}$, of the inductance of the tuning loop with the dynamic capacitance of the solid-state oscillating device being tuned must be kept outside the desired tuning range of the oscillator. The self-resonant frequency, $f_{LR}$, may be kept out of the desired tuning range by minimizing the effective inductance of the tuning loop. One way of minimizing the effective tuning loop inductance is to resonate it with a series capacitance. However, in conventional YIG-tuned solid-state oscillators the effective tuning loop inductance cannot readily be minimized, especially by self-resonating it with a series capacitance, since the required series capacitance (approximately 0.2 *pf*) would be very difficult to realize and would be dominated by parasitic capacitance of the same order of magnitude.

Accordingly, another object of this invention is to provide an improved YIG-tuned solid-state oscillator in which the effective tuning loop inductance may readily be minimized by employing conventional thin film circuit techniques to produce the required series capacitance with minimum parasitics.

Another disadvantage of conventional YIG-tuned solid-state oscillators is that they may jump in frequency due to the solid-state oscillating device locking onto one of the higher order (magnetostatic) modes of the YIG sphere. They are also prone to couple a significant amount of harmonic power to the output coupling loop from the solid-state oscillating device being tuned.

Accordingly, still another object of this invention is to provide an improved YIG-tuned solid-state oscillator in which the magnetostatic modes of the YIG sphere and the harmonic content of the output are both reduced.

These objects are accomplished according to the preferred embodiment of this invention by employing thin film circuit techniques to form a miniaturized output coupling loop and a miniaturized tuning loop on first and second dielectric substrates, respectively, and by mounting these substrates adjacent to a heat sink with the tuning and output coupling loops aligned about a common axis and spaced-apart in parallel planes orthogonally intersecting the common axis. These loops are magnetically coupled by a miniature YIG sphere mounted in a hole through the second substrate and positioned with its center on the common axis between the parallel planes. The output coupling loop is electrically connected in series with a matched transmission line between an oscillator output terminal and a reference potential, and the tuning loop is electrically connected between a bias input and one terminal of a gallium arsenide bulk-oscillating device having its other terminal connected to the reference potential. A high-frequency bypass capacitor and a low-frequency bypass capacitor are electrically connected between the bias input terminal and the reference potential. The high-frequency bypass capacitor and the bulk-oscillating device are mounted on the heat sink adjacent to the first and second substrates in a plane parallel to the common axis and orthogonal to the parallel planes. This minimizes the electrical length of the tuning loop (hence, the effective tuning loop inductance) and thereby maximizes the self-resonant frequency, $f_{LR}$, so that the bulk-oscillating device may be tuned over a frequency range of an octave or more below $f_{LR}$. The effective tuning loop inductance may be further minimized by resonating it with a gap capacitor formed on the second substrate in series with the tuning loop. Bias signal for the bulk-oscillating device cannot then be applied through the tuning loop and is therefore applied through an inductor electrically connected in shunt with the gap capacitor and the tuning loop. It is also possible to tune the bulk-oscillating device over an octave frequency range above $f_{LR}$. This is accomplished by increasing the effective tuning loop inductance until $f_{LR}$ is lowered below the desired YIG tuning range. The output coupling and tuning loops, the YIG sphere, and the bulk-oscillating device are mounted in the gap between the opposite poles of a closed loop electromagnet employed for varying the resonant frequency, $f_o$, of the YIG sphere to tune the oscillator.

DESCRIPTION OF THE PREFERRED EMBODIMENT

Figures 1, 2, 3:
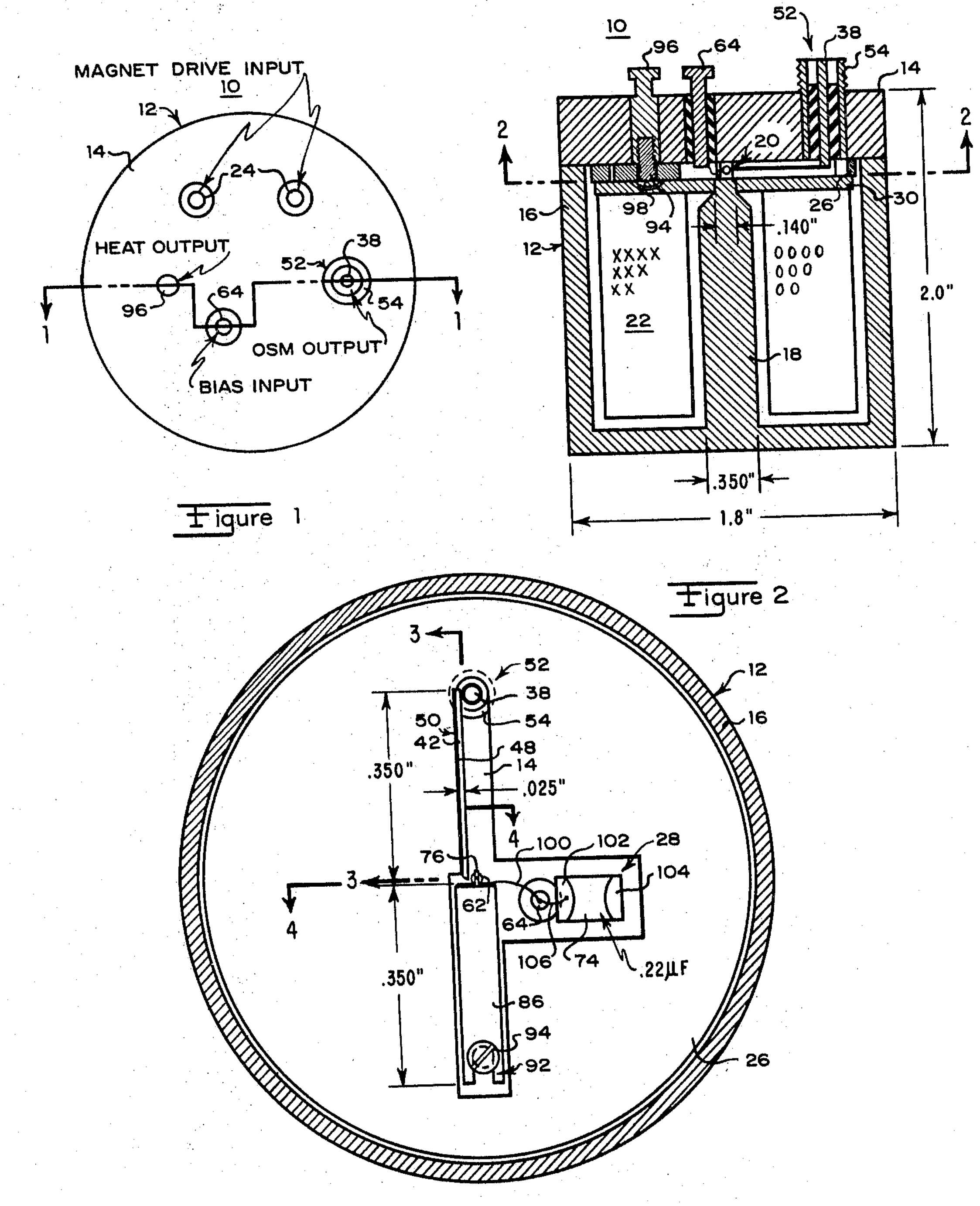
FIG. 1 is a top view of a YIG-tuned solid-state oscillator according to the preferred embodiment of this invention.
FIG. 2 is an elevational sectional view of the oscillator of FIG. 1 as viewed along the line 1–1 of FIG. 1.
FIG. 3 is a plan view of the oscillator of FIGS. 1 and 2 as viewed along the line 2–2 of FIG. 2.
Figure 4:
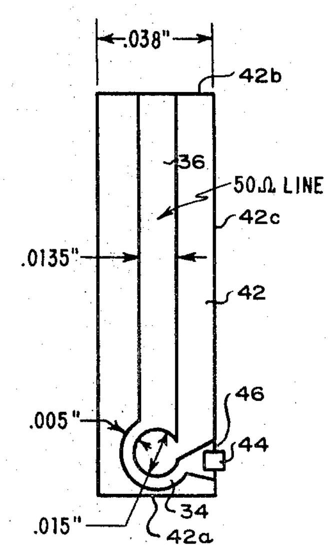
FIG. 4 is a side view of the output coupling loop structure of the oscillator of FIGS. 1 and 2 as viewed along the line 3–3 of FIG. 3.
Figure 5:
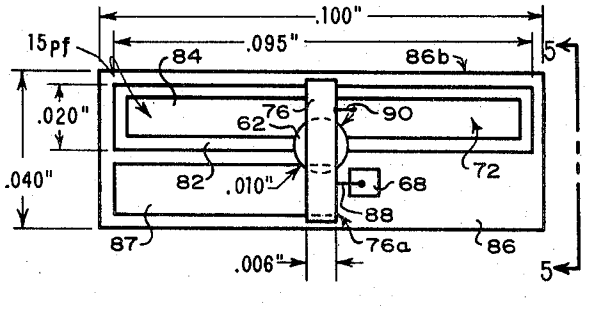
FIG. 5 is a tip view of the heat sink and tuning loop structure of the oscillator of FIGS. 1 and 2 as viewed along the line 4–4 of FIG. 3.
Figure 6:
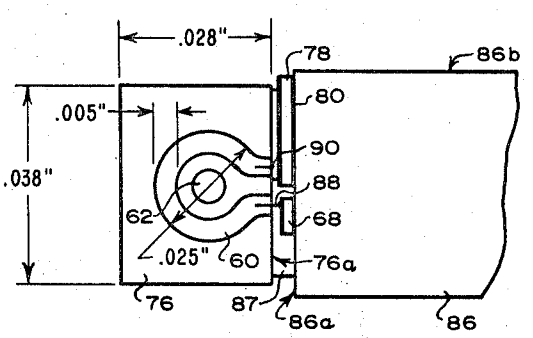
FIG. 6 is a side view of the heat sink and tuning loop structure of the oscillator of FIGS. 1 and 2 as viewed along the line 5–5 of FIG. 5.

Referring to FIGS. 1 and 2, there is shown a YIG-tuned solid-state oscillator 10 constructed with the illustrative dimensions shown in the drawing. Oscillator 10 has a hollow cylindrical housing 12 made of a magnetic material such as "-HYPERNIC." Housing 12 comprises a circular cap 14 and a cylindrical cup 16 with a circular post 18 coaxially disposed therein. Cap 14 is hermetically sealed in abutment with the open end of cup 16 to cover the mouth of the cup. Post 18 extends from the bottom of cup 16 to a position slightly below the bottom of cap 14 to provide a narrow gap 20 (having a depth in the range from about 0.040 to 0.065 of an inch) between the post and the cap. An electrically insulated drive coil 22 is wound around post 18 and serially connected between a pair of magnet drive input terminals 24 fixedly supported by and electrically insulated from cap 14. Drive coil 22 serves with housing 12 to provide a closed loop electromagnet having opposite poles separated by the narrow gap 20. A source of variable input current (not shown) is connected between magnet drive input terminals 24 for varying the magnetic flux across gap 20 to tune oscillator 10.

Oscillator 10 also has a circular plate 26 made of an electrically conductive material such as stainless steel. Circular plate 26 is fixedly mounted in coaxial alignment with cup 16, in abutment with the bottom surface of cap 14, and in abutment with the plane of the top surface of post 18. As shown in FIG. 3, circular plate 26 has a generally T-shaped slot 28 within which the electrical circuits of oscillator 10 are mounted. An annular plate 30 of the same material as circular plate 26 is fixedly mounted in coaxial alignment with cup 16, in abutment with the bottom surface of circular plate 26, and in continuous abutment with a reduced-diameter upper portion of post 18. Annular plate 30 therefore covers slot 28 and prevents RF leakage from the electrical circuits of oscillator 10.

As shown with reference to FIGS. 1—4 and 7, oscillator 10 has an output circuit 32 comprising an output coupling loop 34 and a matched 50 ohm transmission line 36 electrically serially connected between as oscillator output terminal 38 and a reference potential such as ground 40. Output coupling loop 34 comprises a miniaturized gold loop (having an inner diameter in the range from about 0.015 to 0.060 of an inch) formed on the front face of a sapphire substrate 42 adjacent to one end 42*a* thereof. Transmission line 36 comprises a gold strip formed on the front face of substrate 42 and extending from one end of output coupling loop 34 to the other end 42*b* of the substrate. A gold strap 44 is bonded at one end to a gold pad 46 extending from the other end of output coupling loop 34 to the adjacent side 42*c* of substrate 42. The other end of gold strap 44 is bonded to a gold contact layer 48 formed on the backface of substrate 42. Substrate 42 is fixedly mounted within slot 28 by bonding the gold contact layer 48 formed on the backface of the substrate to vertical sidewall 50 of the slot. Since housing 12 is maintained at ground potential during operation of oscillator 10, one end of output coupling loop 34 is electrically connected through gold pad 46, gold strap 44, gold contact layer 48, and stainless steel plate 26 to ground potential 40.

A coaxial OSM (Omnispectra Miniature) output connector 52 is fixedly supported by cap 14 with its outer conductor 54 abutting upon the cap for operation therewith at ground potential. The inner conductor 38 of OSM output connector 52 serves as the output terminal of oscillator 10. It protrudes into slot 28 through a hole in cap 14, is electrically insulated from outer conductor 54 and cap 14, and is bonded to the free end of transmission line 36. Output coupling loop 34 and transmission line 36 are therefore electrically serially connected between the inner conductor 38 and the grounded outer conductor 54 of OSM output connector 52. Thus, a matched 50-ohm load 56 of the type with which oscillator 10 is typically used may be electrically connected across the output circuit 32 of the oscillator by simply connecting the load between the inner and outer conductors of OSM output connector 52 with a mating connector (not shown).

As shown with reference to FIG. 1—3 and 5—7, oscillator 10 has a tuning circuit 58 including a tuning loop 60 magnetically coupled to output coupling loop 34 by a YIG sphere 62. Tuning loop 60 is electrically connected between an oscillator bias input terminal 64 and one terminal 66 of a solid-state oscillating device 68. The other terminal 70 of solid-state oscillating device 68 is electrically connected to a reference potential such as ground 40. A microwave bypass capacitor 72 and a low-frequency bypass capacitor 74 are electrically connected in parallel between oscillator bias input terminal 64 and ground potential 40. Microwave bypass capacitor 72 provides an RF path to ground for oscillations above 2 GHz. Low-frequency bypass capacitor 74 provides a low frequency path to ground for suppressing oscillations below 100 MHz.

Tuning loop 60 comprises a miniaturized gold loop (having an inner diameter in the range from about 0.015 to 0.060 of an inch) formed on the front face of a thin film quartz substrate 76 adjacent to one side 76*a* thereof. Microwave bypass capacitor 72 comprises a silicon semiconductor substrate 78 with a gold terminal layer 80 formed on one face thereof, a dielectric layer 82 of silicon dioxide formed on the opposite face thereof, and another gold terminal layer 84 formed on the dielectric layer. It is mounted on a gold-plated copper heat sink 86 by bonding gold terminal layer 80 to the top end 86*a* of the heat sink along one side 86*b* thereof. Substrate 76 is supported on the top end 86*a* of heat sink 86 in an upright position extending centrally across the heat sink orthogonal to side 86*b*. This is done by bonding the adjacent portion of side 76*a* of substrate 76 to gold terminal layer 84 of microwave bypass capacitor 72. A glass substrate 87 of the same thickness as microwave bypass capacitor 72 is bonded on the top end 86*a* of heat sink 86 to further support substrate 76.

Solid-state oscillator device 68 may comprise an unpackaged gallium arsenide bulk-oscillator chip having a pair of gold terminals formed on oppositely facing surfaces thereof. It is also mounted on heat sink 86 by bonding one of its gold terminals 70 to the top end 86*a* of the heat sink at a position near the center thereof but spaced a finite distance from microwave bypass capacitor 72. A gold wire 88 is bonded to the other gold terminal 66 of bulk-oscillator chip 68 and to one end of tuning loop 60. Another gold wire 90 is bonded to the other end of tuning loop 60 and to gold terminal layer 84 of microwave bypass capacitor 72.

Heat sink 86 has a slotted lower end portion 92 and is held in place in abutment with the bottom surface of cap 14 within the slot 28 of circular plate 26 by the head of a screw 94 that passes through the slotted lower end portion of the heat sink and is screwed into a thermal output connector 96 fixedly supported by the cap. A spherical recess 98 is provided in the top surface of annular plate 30 to provide clearance for the head of screw 94. Heat sink 86 is positioned so that the tuning loop 60 on substrate 76 and the output coupling loop 34 on substrate 42 are spaced slightly above the top end 86*a* of the heat sink, aligned about a common axis, and spaced-apart (from about 0.008 to 0.030 of an inch) in parallel planes orthogonally intersecting the common axis and the top end of the heat sink. YIG sphere 62 (a miniaturized sphere of from about 0.010 to 0.040 of an inch in diameter) is centrally mounted in a circular hole formed through substrate 76 along the common axis. The center of YIG sphere 62 is therefore positioned along the common axis between the parallel planes in which output coupling loop 34 and tuning loop 60 are mounted. YIG sphere 62 magnetically couples tuning loop 60 to output coupling loop 34 at a frequency related to the resonant frequency, $f_o$, of the YIG sphere. The current applied to magnet drive input terminals 24 is therefore varied to vary the resonant frequency, $f_o$, of the YIG sphere and thereby tune the oscillator. Drive coil 22 must have an inductance of approximately 1 henry in order to produce the necessary magnetic field to resonate the YIG sphere 62 over a tuning range of an octave or more. It therefore responds at less than kilohertz rates to changes in applied drive current. For many applications it is necessary to provide narrow band modulations (for example, one megahertz peak deviation) at megahertz rates. This can be achieved by applying a modulation current to several turns of an insulated tuning coil (not shown) placed around the reduced-diameter upper portion of post 18 adjacent to gap 20. A still higher frequency modulation response can be achieved by applying the modulation current directly to output coupling loop 34 from oscillator output terminal 38. Output coupling loop 34 has essentially uniform coupling to YIG sphere 62 up through the microwave frequency range.

Oscillator bias input terminal 64 is fixedly supported by and electrically insulated from cap 14. A gold wire 100 is bonded to gold terminal layer 84 of microwave bypass capacitor 72 and to a portion of oscillator bias input terminal 64 that protrudes through a hole in cap 14 into the slot 28 in circular plate 26. Microwave bypass capacitor 72 is therefore electrically connected between oscillator bias input terminal 64 and ground potential 40 by gold wire 100 and heat sink 86. Tuning loop 60 is electrically serially connected between oscillator bias input terminal 64 and one terminal 66 of bulk oscillator bias input terminal 64 and one terminal 66 of bulk oscillator chip 68 by gold wires 88 and 100. Since housing 12 is maintained at ground potential during operation of oscillator 10, the other terminal 70 of bulk oscillator chip 68 is electrically connected by heat sink 86 to ground potential 40. Bias signal for bulk oscillator chip 68 therefore flows from oscillator bias input terminal 64 through tuning loop 60 and bulk oscillator chip 68 to ground.

Low-frequency bypass capacitor 74 comprises a commercially available block capacitor with a pair of end terminals 102 and 104. It is fixedly mounted in abutment with the bottom surface of cap 14 within the slot 28 of circulate plate 26. End terminal 102 is positioned above a recess (not shown) in the bottom surface of cap 14 so that end terminal 102 is electrically insulated from cap 14 and, hence, ground potential 40. A gold wire 106 is bonded to end terminal 102 of low-frequency bypass capacitor 74 and to oscillator bias input terminal 64. End terminal 104 of low-frequency bypass capacitor 74 is soldered in abutment with the bottom surface of cap 14. Low-frequency bypass capacitor 74 is therefore electrically connected in parallel with microwave bypass capacitor 72 between oscillator bias input terminal 64 and ground potential 40 by gold wire 106 and abutment with cap 14.

Figure 8:
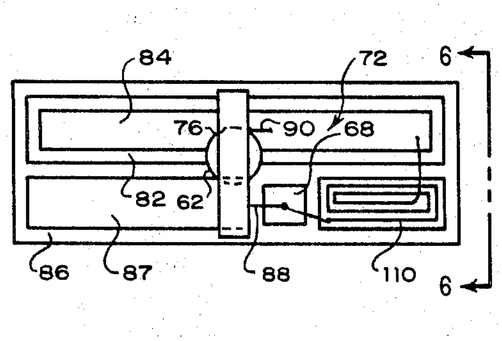
FIG. 8 is a top view of another embodiment of the heat sink and tuning loop structure of the oscillator of FIGS. 1 and 2 as viewed along the line 4–4 of FIG. 3.
Figure 9:
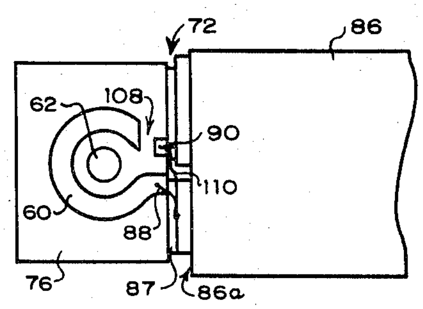
FIG. 9 is a side view of the heat sink and tuning loop structure of FIG. 8 as viewed along the line 6–6 of FIG. 8.
Figure 7:
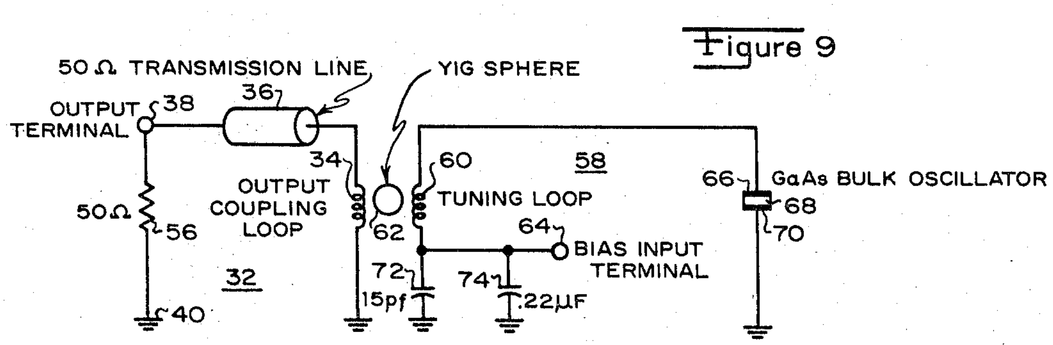
FIG. 7 is a schematic diagram of the electrical circuit of the oscillator of FIGS. 1 and 2.

The above-described oscillator design minimizes the effective inductance of tuning loop 60, thereby increasing the self-resonant frequency, $f_{LR}$, and, hence, the frequency range over which the oscillator may be continuously tuned below $f_{LR}$. As shown with reference to FIGS. 8 and 9, this design also makes it possible to accurately define a gap capacitance 108 of only a few tenths of a picofarad on substrate 76 in series with tuning loop 60. The effective inductance of tuning loop 60 may be further minimized by resonating it with gap capacitance 108. This further increases $f_{LR}$ and, hence, the tuning range of the oscillator below $f_{LR}$. In this case, however, bias signal for bulk oscillator chip 68 cannot be applied through tuning loop 60. The bulk oscillator bias signal is therefore applied through an inductor 110 electrically connected in shunt with gap capacitance 108 and tuning loop 60. Inductor 110 may comprise a coil insulated from heat sink 86, bonded at one end to terminal 66 of bulk oscillator chip 68, and bonded at the other end to gold terminal layer 84 of microwave bypass capacitor 72.

The miniaturized output coupling and tuning loops 34 and 60 employed in oscillator 10 may be batch fabricated on a single substrate by employing conventional thin-film circuit techniques. Holes are drilled in this substrate at the YIG sphere locations within the tuning loops, and the substrate is then diced into individual output coupling and tuning loop structures. Loaded resonant coupling impedances of more than 200 ohms may be produced in parallel with the bulk-oscillator chip 68 by close coupling with a YIG sphere 62 of from 0.010 to 0.040 of an inch in diameter. The self-resonant frequency, $f_{LR}$, of the inductance of tuning loop 60 with the dynamic capacitance of bulk-oscillator chip 68 may exceed 12 GHz. for a YIG sphere of 0.010 of an inch in diameter. An oscillator 10 as small in size as indicated by the illustrative dimensions in the drawing and weighing only about 18 ounces may be tuned over a range of 4—12 GHz with a minimum output power of +10 dbm. A maximum of about 800 milliwatts of magnet power is required to tune the oscillator over this range. The second and third harmonic content of the power output is down at least 30 db. from the fundamental over the tuning range. Magnetostatic modes are suppressed because the YIG sphere 62 is centrally mounted on the axis of symmetry of tuning loop 60 so that a uniform RF field is provided all around the YIG sphere.

I claim:

1. A YIG-tuned solid-state oscillator comprising:

an input;

an output;

an output coupling loop mounted in a first plane about an axis orthogonally intersecting the first plane, said output coupling loop being serially connected between the output and a reference potential;

a tuning loop mounted in a second plane parallel to the first plane and positioned about the same axis as the output coupling loop, said tuning loop being electrically connected between the input and the reference potential;

a solid-state oscillating device electrically connected in series with the tuning loop between the tuning loop and the reference potential;

a YIG sphere mounted along the axis about which the output coupling and tuning loops are positioned, said YIG sphere magnetically coupling the tuning loop to the output coupling loop; and means for resonating the YIG sphere.

2. A YIG-tuned solid-state oscillator as in claim 1 wherein:

said YIG sphere magnetically couples the tuning loop to the output coupling loop at a frequency related to the resonant frequency of the YIG sphere; and said means comprises a closed loop electromagnet for varying the resonant frequency of the YIG sphere, said electromagnet having a gap within which the output coupling and tuning loops, the YIG sphere, and the solid-state oscillating device are mounted between opposite poles of the electromagnet.

3. A YIG-tuned solid-state oscillator as in claim 2 including a heat sink on which the solid-state oscillating device is mounted in a third plane orthogonal to the first and second planes and parallel to the axis about which the output coupling and tuning loops are positioned, said output coupling and tuning loops being mounted adjacent to the third plane.

4. A YIG-tuned solid-state oscillator as in claim 3 including a first bypass capacitor mounted on the heat sink in the third plane, said first bypass capacitor being electrically connected between the input and the reference potential.

5. A YIG-tuned solid-state oscillator as in claim 4 including an impedance electrically connected between the input and the reference potential in parallel with the first bypass capacitor.

6. A YIG-tuned solid-state oscillator as in claim 5 wherein said impedance is a second bypass capacitor having a different value than the first bypass capacitor.

7. A YIG-tuned solid-state oscillator as in claim 6 wherein:

said output coupling loop is formed on a first dielectric substrate mounted adjacent to the heat sink;

said tuning loop is aligned with the output coupling loop and formed on a second dielectric substrate mounted adjacent to the heat sink; and said YIG sphere is mounted in a hole formed through the second substrate within the tuning loop, said YIG sphere having its center positioned between the first and second planes.

8. A YIG-tuned solid-state oscillator as in claim 7 wherein said electromagnet includes:

a hollow cylindrical housing of magnetic material with a central post extending from one end of the housing toward the other end of the housing, said post being spaced a finite distance from said other end of the housing to provide the gap between the opposite poles of the electromagnet;

a pair of magnet drive input terminals supported by and electrically insulated from the housing; and an electrically insulated drive coil supported about the post and electrically connected between the magnet drive input terminals.

9. A YIG-tuned solid-state oscillator as in claim 8 wherein:

said oscillator includes a first circular plate having a slot therethrough, said first plate being mounted at said other end of the housing with its slot passing between the post and said other end of the housing;

said oscillator includes a second circular plate with a hole therethrough for receiving the post, said second circular plate being mounted over the first circular plate to cover the slot therein;

said first substrate is mounted on a vertical sidewall of the slot in the first circular plate between the second circular plate and said other end of the housing;

said heat sink is mounted at said other end of the housing within the slot in the first circular plate and adjacent to the first substrate;

said second substrate is supported by the heat sink within the slot in the first circular plate and parallel and adjacent to the first substrate; and said second bypass capacitor is mounted at said other end of the housing within the slot in the first circular plate.

10. A YIG-tuned solid-state oscillator as in claim 9 wherein:

said gap has a depth in the range from about 0.040 to about 0.065 of an inch;

said output coupling and tuning loops have inner diameters in the range from about 0.015 to 0.060 of an inch;

said YIG sphere has a diameter in the range from about 0.010 to about 0.040 of an inch;

said output coupling and tuning loops are spaced-apart from about 0.008 to about 0.030 of an inch;

said solid-state oscillating device comprises a gallium arsenide bulk-oscillator chip;

said first bypass capacitor comprises a microwave bypass capacitor for bypassing signals having a frequency greater than 2 GHz.; and said second bypass capacitor comprises a low-frequency bypass capacitor for bypassing signals having a frequency below 100 MHz.

11. A YIG-tuned solid-state oscillator as in claim 2 including a tuning coil mounted adjacent to the gap between the opposite poles of the electromagnet to modulate the output of the oscillator.

12. A YIG-tuned solid-state oscillator as in claim 1 wherein means are electrically connected to the output coupling loop to modulate the output of the oscillator.

13. A YIG-tuned solid-state oscillator as in claim 1 including:

a capacitance mounted in the second plane in series with the tuning loop so that the effective inductance of the tuning loop may resonate with said capacitance to reduce the electrical length of the tuning loop; and an inductance electrically connected across said capacitance and the tuning loop between the input and the solid-state oscillating device.